(12) United States Patent
Kim et al.

(10) Patent No.: US 7,393,710 B2
(45) Date of Patent: Jul. 1, 2008

(54) FABRICATION METHOD OF MULTI-WAVELENGTH SEMICONDUCTOR LASER DEVICE

(75) Inventors: Jin Chul Kim, Kyungki-do (KR); Su Yeol Lee, Kyungki-do (KR); Chang Zoo Kim, Kyungki-do (KR); Sang Heon Han, Kyungki-do (KR); Keun Man Song, Seoul (KR); Tae Jun Kim, Kyungki-do (KR); Seok Beom Choi, Daejeon (KR)

(73) Assignee: Samsung Electro-Mechanics Co., Ltd, Suwon, Kyungki-Do (KR)

( * ) Notice: Subject to any disclaimer, the term of this patent is extended or adjusted under 35 U.S.C. 154(b) by 69 days.

(21) Appl. No.: 11/247,935

(22) Filed: Oct. 11, 2005

(65) Prior Publication Data

US 2006/0088950 A1    Apr. 27, 2006

(30) Foreign Application Priority Data

Oct. 26, 2004  (KR) .................. 10-2004-0085774
Oct. 29, 2004  (KR) .................. 10-2004-0087213

(51) Int. Cl.
*H01L 21/00*     (2006.01)
(52) U.S. Cl. ................. 438/35; 438/22; 438/493; 257/E21.131; 372/44.01; 372/50.121
(58) Field of Classification Search ........... 438/22, 438/33, 34, 35, 46, 778, 946, 493, 494, 496; 372/23, 50.1, 50.121, 50.12; 257/E21.131
See application file for complete search history.

(56) References Cited

U.S. PATENT DOCUMENTS

| | | | | |
|---|---|---|---|---|
| 5,134,090 | A | * | 7/1992 | Bean et al. .............. 438/492 |
| 5,464,784 | A | * | 11/1995 | Crisenza et al. .......... 438/275 |
| 5,518,955 | A | * | 5/1996 | Goto et al. .............. 438/494 |
| 5,953,359 | A | * | 9/1999 | Yamaguchi et al. ..... 372/50.12 |
| 6,171,935 | B1 | * | 1/2001 | Nance et al. ............ 438/494 |
| 6,242,326 | B1 | * | 6/2001 | Ro et al. ................ 438/493 |

(Continued)

FOREIGN PATENT DOCUMENTS

| JP | | 200224396 | A | * | 8/2002 |
|---|---|---|---|---|---|
| JP | | 2002243964 | A | * | 8/2002 |

OTHER PUBLICATIONS

Arakawa, Satoshi et al. "Improvement of MOCVD Growth Technique Using CBr4 ", Furukawa Review, Apr. 2003, No. 23, pp. 76-81.*

(Continued)

*Primary Examiner*—Carl Whitehead, Jr.
*Assistant Examiner*—Sun M Kim
(74) *Attorney, Agent, or Firm*—Volpe and Koenig P.C.

(57) ABSTRACT

The present invention relates to a two-wavelength semiconductor laser device, more particularly, to a fabrication method of a multi-wavelength semiconductor laser device. In this method, a substrate having an upper surface separated into at least first and second areas is provided. Then, a first dielectric mask on the substrate is formed to expose only the first area. Then, epitaxial layers for a first semiconductor laser are grown on the first area of the substrate. Then, a second dielectric mask on the substrate is formed to expose only the second area. Then, epitaxial layers for a second semiconductor laser are grown on the second area of the substrate.

17 Claims, 4 Drawing Sheets

U.S. PATENT DOCUMENTS

| | | | | |
|---|---|---|---|---|
| 6,350,629 B1* | 2/2002 | Sakata | ......................... | 438/44 |
| 6,399,404 B2* | 6/2002 | Sakata | ......................... | 438/22 |
| 6,680,958 B1* | 1/2004 | Nemoto | ................... | 372/43.01 |
| 7,118,932 B2* | 10/2006 | Nakamura | ................... | 438/31 |
| 2005/0103259 A1* | 5/2005 | Bang et al. | ................. | 438/496 |

OTHER PUBLICATIONS

Ghosh, C. and Layman, R.L., "Selective area growth of gallium arsenide by metalorganic vapor phase epitaxy", Appl. Phys. Lett., Dec. 1, 1984, vol. 45, Iss. 11, pp. 1229-1231.*

* cited by examiner

FABRICATION METHOD OF MULTI-WAVELENGTH SEMICONDUCTOR LASER DEVICE

CLAIM OF PRIORITY

This application claims the benefit of Korean Patent Application Nos. 2004-85774 filed on Oct. 26, 2004 and 2004-87213 filed on Oct. 29, 2004, in the Korean Intellectual Property Office, the disclosure of which is incorporated herein by reference.

BACKGROUND OF THE INVENTION

1. Field of the Invention

The present invention relates to a multi-wavelength semiconductor laser, and more particularly, to a fabrication method of a multi-wavelength semiconductor laser capable of emitting laser beams of different wavelengths simultaneously or selectively.

2. Description of the Related Art

In general, a semiconductor laser is a semiconductor device outputting light amplified by induced emission, with the emitted light having a narrow frequency bandwidth, excellent directivity, and guaranteed high output. Because of these merits, it is popular as a light source for the optical pick-up devices for optical disc systems such as a Compact Disc (CD) or a Digital Video Disc (DVD).

Recently, the field of optical disc technology requires a multi-wavelength semiconductor laser device capable of oscillating two or more of different wavelengths. The most representative example is a two-wavelength semiconductor laser used for the relatively low-density CD player (780 nm) and the relatively high-density DVD player (635 nm or 650 nm).

FIGS. 1a through 1f are process flow diagrams illustrating a fabrication method of a conventional two-wavelength semiconductor laser device. More specifically, these diagrams illustrate the fabrication method of a two-wavelength semiconductor laser device in which the AlGaAs-based first semiconductor laser (780 nm wavelength light) and the AlGaInP-based second semiconductor laser (650 nm wavelength light) are provided monolithically on a single substrate.

First, as shown in FIG. 1a, epitaxial layers for a first semiconductor laser are formed on an n-type GaAs substrate 11. That is, an n-type AlGaAs cladding layer 13a, an AlGaAs-based active layer 14a, a p-type AlGaAs cladding layer 15a, and a p-type cap layer 16a are grown in their order.

Thereafter, as shown in FIG. 1b, the epitaxial layers 13a, 14a, 15a, and 16a are removed selectively to expose an area on the surface of the GaAs substrate 11 via photolithography and etching processes.

Thereafter, as shown in FIG. 1c, epitaxial layers for a second semiconductor laser are formed on the exposed surface of the GaAs substrate 11. That is, the n-type AlGaInP cladding layer 13b, the AlGaInP-based active layer 14b, the p-type AlGaInP cladding layer 15b, and the p-type cap layer 16b are grown in their order.

Thereafter, as shown in FIG. 1d, epitaxial layer 13b, 14b, 15b, and 16b portions of the second semiconductor laser on the epitaxial layers 13a, 14a, 15a, and 16a of the first semiconductor laser are removed via additional photolithography and etching processes, and simultaneously, the remaining epitaxial structure of the second semiconductor laser is separated from that of the first semiconductor laser.

Next, as shown in FIG. 1e, the p-type AlGaAs cladding layer 15a and the p-type AlGaInP cladding layer 15b are selectively etched by the conventional method to form ridge structures to improve the current injection efficiency.

Lastly, as shown in FIG. 1f, current limiting layers 18a and 18b are formed on the p-type cladding layers 15a and 15b each with the ridge structure formed thereon, and then, each p-type cap layer is exposed via photolithography and etching processes. Then, p-side electrodes 19a and 19b are formed with Ti, Pt and Au and alloys thereof on the p-type cap layers 16a and 16b, and an n-side electrode 19c is formed with Au/Ge, Au, Ni and alloys thereof on the underside of the GaAs substrate 11.

As explained in the above process, semiconductor lasers 10a and 10b with two different wavelengths can be formed on the same substrate 11 to provide a two-wavelength laser device 10 in a single chip form.

However, in the conventional fabrication method of a two-wavelength semiconductor laser, not only photolithography and etching processes have to be repeated for so many times but also the etching process for separation of laser devices shown in FIG. 1d requires complex etching conditions, complicating the entire processes, which results in a lower yield.

Particularly, since high selectivity of the AlGaAs-based epitaxial layer of the first semiconductor laser and the GaAs substrate is not guaranteed, the surface of the substrate on which the second semiconductor is to be subsequently grown after the etching process in FIG. 1b may easily be damaged, and in some severe cases, part of the substrate may be etched in a certain depth. Therefore, in the conventional method, it may be difficult to obtain quality epitaxial layers, and also may cause inadequate alignment in which the active layers of the two lasers may be vertically misaligned with certain size of gap.

SUMMARY OF THE INVENTION

The present invention has been made to solve the foregoing problems of the prior art and it is therefore an object of the present invention to provide a fabrication method of a multi-wavelength semiconductor laser device which utilizes a dielectric mask to conduct procedures of growing epitaxial layers having an excellent local selectivity, thereby providing a semiconductor laser device with excellent crystallinity and easy laser alignment.

According to an aspect of the invention for realizing the object, the present invention provides a fabrication method of a multi-wavelength semiconductor laser including the following steps of:

(a) providing a substrate having a surface separated into at least first and second areas;

(b) forming a first dielectric mask on the substrate to expose only the first area;

(c) growing epitaxial layers for a first semiconductor laser on the first area of the substrate;

(d) forming a second dielectric mask on the substrate to expose only the second area; and (e) growing epitaxial layers for a second semiconductor laser on the second area of the substrate.

The step (a) of forming the first dielectric mask includes steps of forming of dielectric film on the upper surface of the substrate, and removing the dielectric film on the first area to form the first dielectric mask.

In addition, the step (d) of forming the second dielectric mask includes steps of forming additional dielectric film on the surface of the substrate with the remaining first dielectric mask, and removing parts of the dielectric films and the first dielectric mask from the second area to form the second dielectric mask. In this case, in order to prevent the increment of layer difference owing to the function of the mask and the thickness of the layer, it is preferable that the first dielectric mask and the dielectric film have a thickness of about 0.1 to 0.3 μm, respectively.

In a preferred embodiment of the present invention, the steps (c) and (e) of growing the epitaxial layers for the first and second semiconductor lasers may be conducted in a step of providing etching gas so that a polycrystal layer is not grown on the first and second dielectric masks, respectively. The etching gas used in this embodiment may be gas containing $CBr_4$.

In another embodiment for removing the undesired polycrystal layer, a step of lifting off the first dielectric mask to remove also the polycrystal layer on the first dielectric mask formed in the step (c) of growing the epitaxial layer of the first semiconductor laser, may be further included between the step (c) of growing the epitaxial layers of the first semiconductor laser and and the step (d) of forming the second dielectric mask.

In this embodiment, the step of lifting off the first dielectric mask may be conducted in a step of lifting off the first dielectric mask by applying vibrations via ultrasonic waves, together with BOE etchant on the first dielectric mask. At this time, a HF-based etchant may be used as the BOE etchant.

Likewise, after the step (e) of growing the epitaxial layers for the second semiconductor laser, a step of lifting off the second dielectric mask to remove the polycrystal layer on the second dielectric mask formed in the step (e) may further be included.

In the preferred embodiment of the present invention, it is preferable that the width of the first and second dielectric masks is about 4 to 50 μm, and the width of the first and second areas is about 2 to 30 μm. The steps of forming the epitaxial layers for the first and second semiconductor lasers in the steps (c) and (e) may be conducted via a Metal Organic Chemical Vapor Deposition (MOCVD) process.

In addition, the steps of forming the epitaxial layers for the first and second semiconductor lasers in the steps (c) and (e) may be realized in the steps of forming a first conductive cladding layer, an active layer, a second conductive cladding layer and a cap layer in their order, respectively. At this time, after the epitaxial layers for the second semiconductor laser are grown, the following steps of forming a dielectric film to cover the epitaxial layer of the first and second semiconductor lasers on the upper surface of the substrate, and selectively removing the first and second dielectric masks and the dielectric film to expose the cap layer of the first and second semiconductor lasers, and forming a first and second electrodes on the underside of the substrate and the exposed cap layer may be further included. The dielectric film together with the remaining first and second dielectric masks may be provided as a passivation layer.

The fabrication method of a semiconductor laser according to the present invention may be adapted to a method of providing a laser having three or more of different wavelengths on a single substrate. More specifically, such fabrication method may be realized with a substrate having an additional third area separated from the first and second areas on the substrate, and by further including steps of forming a third dielectric mask on the substrate to expose only the third area on the substrate after growing the epitaxial layers for the second semiconductor laser, and growing the epitaxial layers for the third semiconductor laser on the third area of the substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

FIGS. 2a through 2f are sectional views illustrating procedures of a fabrication method of a two-wavelength semiconductor laser according to an embodiment of the present invention. That is, these diagrams illustrate a fabrication method of a two-wavelength semiconductor laser device with a first semiconductor laser of 780 nm wavelength and a second semiconductor laser of 650 nm wavelength on a single substrate 21.

Figure 1:
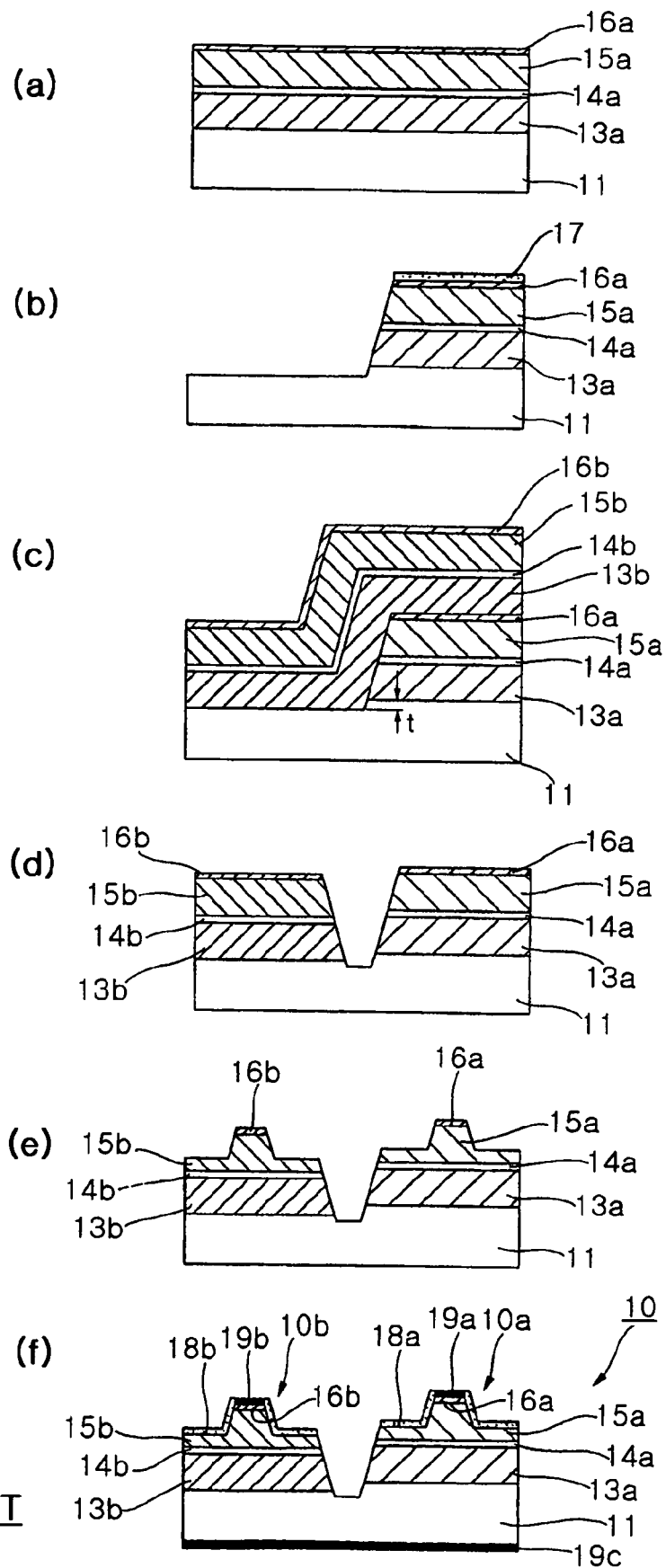
FIGS. 1a through 1f are sectional views illustrating the procedures of the conventional fabrication method of a two-wavelength semiconductor laser.
Figure 2:
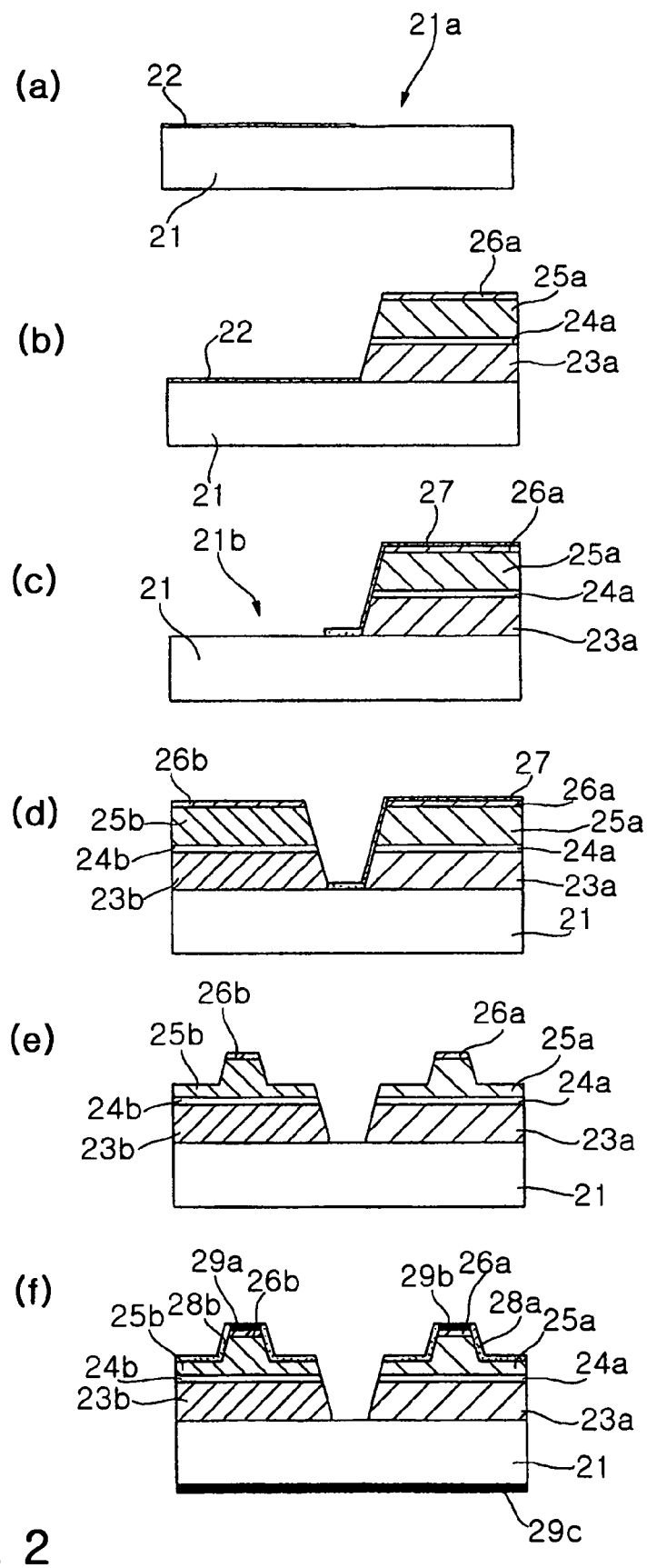
FIGS. 2a through 2f are sectional views illustrating procedures of a fabrication method of a two-wavelength semiconductor laser according to the first embodiment of the present invention.

First, as shown in FIG. 2a, a first dielectric mask 22 with an exposed first area 21a is formed on an n-type GaAs substrate 21. The first dielectric mask 22 may be formed by depositing the dielectric film on the entire surface of the substrate 21, and then exposing the first area 21a via appropriate photolithography and etching processes. Preferably, the thickness of the dielectric film deposited in the process may be about 0.1 to 0.3 μm, and the first dielectric mask 22 may be of $SiO_2$ or $SiN_x$. During the subsequent growth of epitaxial layers, the crystal growth is suppressed on the first dielectric mask 22, whereas the desired crystal growth can be obtained only on the exposed first area 21a.

Thereafter, as shown in FIG. 2b, epitaxial layers for the first semiconductor laser, i.e. an n-type AlGaAs cladding layer 23a, an AlGaAs-based active layer 24a, a p-type AlGaAs cladding layer 25a and a p-type cap layer 26a are grown in their order on the first area 21a of the n-type GaAs substrate 21. Such growth may be conducted preferably via a MOCVD process, in which case, appropriate etching gas may be injected to prevent the formation of the undesired polycrystalline on the first dielectric mask 22. Examples of such etching gas may include $CBr_4$-based etchant. On the other hand, formation of polycrystalline may also be prevented on the dielectric mask 22, without injecting etching gas, by appropriately adjusting the thickness of the first dielectric mask 22, the width of the open area (e.g., the exposed area) and V/III ratio to guarantee a high selectivity. Such process is called selective area growth (SAG) MOCVD.

Thereafter, as shown in FIG. 2c, a second dielectric mask 27 is formed on the substrate 21 to expose only the second area 21b. Similar to the formation process of the first dielectric mask 22, the second dielectric mask 27 may be formed by depositing the additional dielectric film and then exposing the second area 21b via photolithography and etching processes. The second dielectric mask 22 may be of $SiO_2$ or $SiN_x$, identical with the first dielectric mask. The thickness of the dielectric film deposited at this time may be about 0.1 to 0.3 μm. In addition, as the second dielectric mask 27 can be formed without removing the first dielectric mask 22, the second dielectric mask 27 may substantially include the first dielectric mask 22.

Thereafter, as shown in FIG. 2d, the epitaxial layers for the second semiconductor laser, i.e. the n-type AlGaInP cladding layer 23b, the AlGaInP-based active area 24b, the p-type AlGaInP cladding layer 25b, and the p-type cap layer 26b are grown in their order on the second area 21b of the GaAs substrate 21. The second area 21b of the substrate where the growth of the epitaxial layers is conducted, is a surface with the above dielectric material (e.g. the first dielectric mask) removed, and thus, not damaged as in the conventional dry etching process on the semiconductor crystal, and can maintain the same height as the first area 21a. Therefore, not only high crystallinity of the epitaxial layers for the second semiconductor laser can be guaranteed, but also the inadequate alignment between the two lasers can be prevented. Similar to the method illustrated in FIG. 2b, such growth procedures may be conducted with the etchant gas such as CBr.sub.4-based gas injected to prevent the formation of polycrystalline, and also via a SAG MOCVD process, taking account of the thickness of the second dielectric mask 27, the width of the open area, and V/III ratio.

Thereafter, as shown in FIG. 2e, the p-type AlGaAs cladding layer 25a and the p-type AlGaInP cladding layer 25b, together with the p-type cap layers 26a and 26b are selectively etched by the conventional method to form ridge structures for improving current injection efficiency. Such formation procedures of the ridge structures may be facilitated by inserting an etch-stop layer (not shown) inside each of the p-type cladding layers 25a and 25b.

Finally, as shown in FIG. 2f, on the upper surface of the p-type cladding layers 25a and 25b with the ridge formed thereon, current limiting layers 28a and 28b are formed with dielectric material. Then, after conducting photolithography and etching processes to expose each p-type cap layer 26a and 26b, p-side electrodes 29a and 29b and an n-side electrode 29c are formed on the exposed p-type cap layers 26a and 26b and on the underside of the GaAs substrate. In general, the p-side electrodes 29a and 29b are made of at least one selected from a group including Ti, Pt and Au and alloys thereof, and the n-side electrode 29c is made of at least one selected from a group including Au/Ge, Au and Ni and alloys thereof.

FIGS. 3a through 3g are sectional views illustrating procedures of a fabrication method of a two-wavelength semiconductor laser according to another embodiment of the present invention. This embodiment is an example of the wafer-level process, in which each semiconductor laser formed on the same substrate is grown in a structure narrowing gradually to the top, without the provision of a separate ridge structure.

Figure 3:
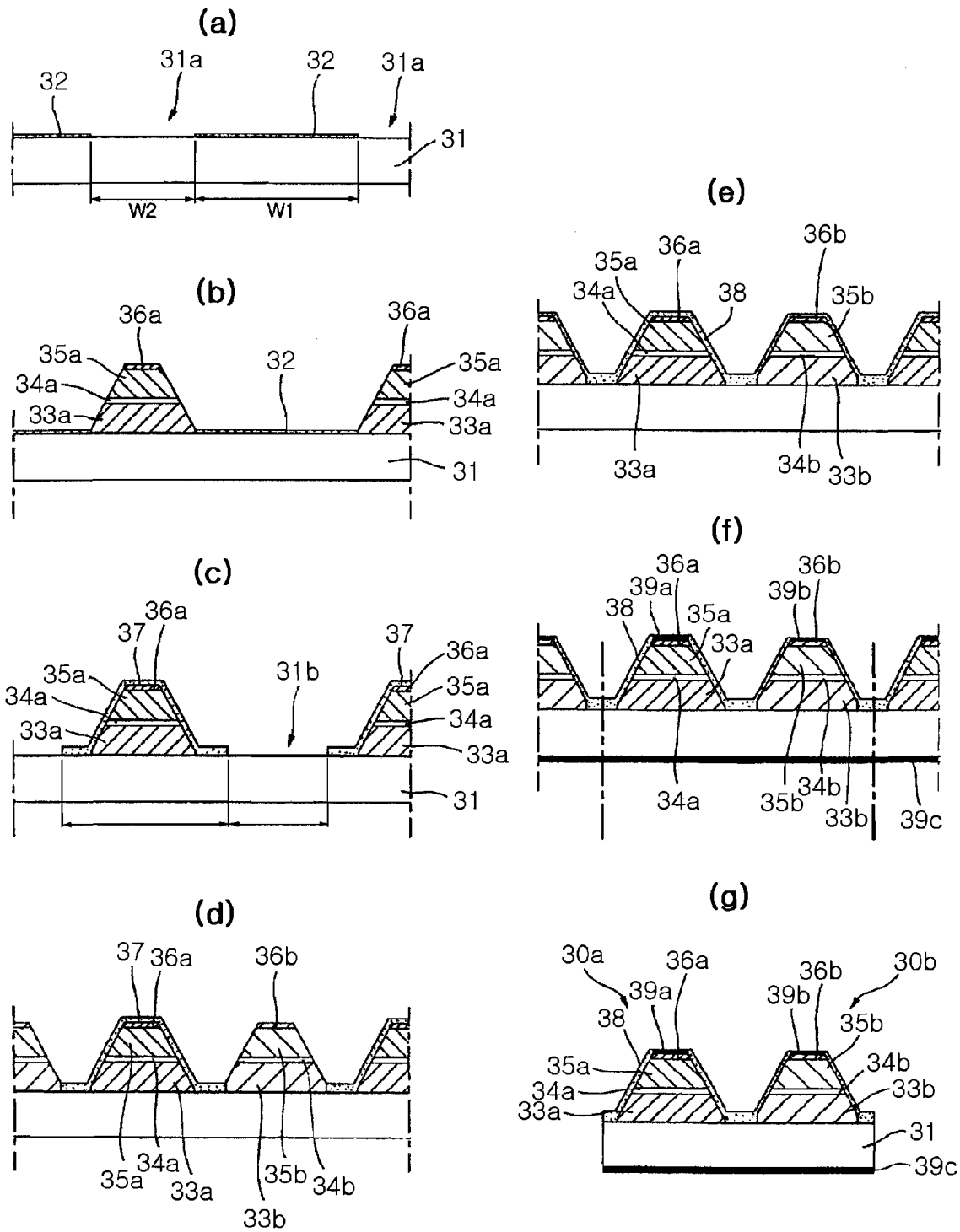
FIGS. 3a through 3g are sectional views illustrating procedures of a fabrication method of a two-wavelength semiconductor laser according to an improvement of the first embodiment of the present invention.

First, as shown in FIG. 3a, the first dielectric mask 32 with the exposed first area is formed on the n-type GaAs wafer 31. Preferably, the first dielectric mask 32 may be of $SiO_2$ or $SiN_x$. As the crystal growth does not take place on the first dielectric mask, only the exposed first area 31a is provided as a surface for the crystal growth. As described above, in case of adopting a SAG MOCVD process, not only the thickness of the dielectric mask but also the width of the dielectric mask, the width of the open area and V/III ratio may be adjusted to guarantee high selectivity and to prevent the formation of the polycrystalline on the first dielectric mask 32. Preferably, the first dielectric mask 32 has the thickness t1 of about 0.1 to 0.3 μm. Preferably, the first dielectric mask 32 has the width W1 of about 4 to 50 μm each, and the resultant open area, i.e. the first area 31a has the width W2 of about 2 to 30 μm. Under such conditions, V/III ratio may be adjusted appropriately to suppress the formation of undesired polycrystalline, and to allow growth of the crystal layer with improved quality of deformation of epitaxial layers to be subsequently grown and surface morphology, etc., at the same time.

Thereafter, as shown in FIG. 3b, the n-type AlGaAs cladding layer 33a, the AlGaAs-based active area 34a, the p-type AlGaAs cladding layer 35a and the p-type cap layer 36a for the first semiconductor laser are grown in their order on the first area 31a of the GaAs wafer 31. In this step of forming the above epitaxial layers 33a, 34a, 35a, and 36a, the formation of undesired polycrystalline layer on the first dielectric mask 32 may be prevented with the above described conditions for SAG-MOCVD. However, independently from or simultaneously with this condition, the step of injecting etching gas such as $CBr_4$-based gas may be conducted to remove the polycrystalline layer.

Thereafter, as shown in FIG. 3c, the second dielectric mask 37 may be formed on the substrate 31 to expose only the second area 31b. The second dielectric mask 37 may be formed by depositing the additional dielectric film on the substrate 31 with the remaining first dielectric mask 32, and then exposing the second area 31b via appropriate photolithography and etching processes. The second dielectric mask 37 may be of $SiO_2$ or $SiN_x$, identical with the first dielectric mask 32. Similar to the above described conditions for SAG-MOCVD, it is preferable that the width W3 of the second dielectric mask 37 is about 4 to 50 μm, and the width W4 of the second area is about 2 to 30 μm.

Thereafter, as shown in FIG. 3d, the n-type AlGaInP cladding layer 33b, the AlGaInP-based active area 34b, the p-type AlGaInP cladding layer 35b and the p-type cap layer 36b for the second semiconductor laser are grown in their order on the second area 31b of the GaAs substrate 31. The second area 31b of the substrate, where the growth of the epitaxial layers is conducted, is a surface with the above dielectric material (e.g. the first dielectric mask 31a) removed, which provides a relatively good condition for the growth. Therefore, excellent crystal growth can be guaranteed on the second area 31b which can maintain the same height as the first area 31a. Such growth process may be conducted with the etchant gas such as $CBr_4$-based gas injected to prevent the formation of the polycrystalline, similar to the process illustrated in FIG. 3b.

Thereafter, as shown in FIG. 3e, the additional dielectric film 38 may be formed on the substrate 31 to cover the epitaxial layers of the first and second semiconductor lasers. Preferably, the additional dielectric film 38 may be of identical material with the first and second dielectric masks 32 and 37.

Thereafter, as shown in FIG. 3f, the dielectric film 38 (including the first and second dielectric masks) is selectively removed to expose the p-type cap layers 36a and 36b of the first and second semiconductor lasers, and the n-side and p-side electrodes 39c, 39a and 39b are formed on the underside of the substrate 31 and on the exposed p-type cap layers 36a and 36b. At this time, the dielectric film 38 together with the remaining first and second dielectric material 32 and 37 is provided as a passivation layer.

Finally, as shown in FIG. 3g, the wafer 31 is cut into each unit of two semiconductor lasers to obtain the desired two-wavelength semiconductor laser device 30. This two-wavelength semiconductor laser has two semiconductor lasers composed of two different components on the same substrate.

In another embodiment of the present invention, a lift-off process of the first dielectric mask may be adopted to remove the undesired polycrystalline layer formed during the growth process of the epitaxial layers. FIGS. 4a through 4f illustrate such procedures of fabricating a two-wavelength semiconductor laser according to this embodiment.

Figure 4:
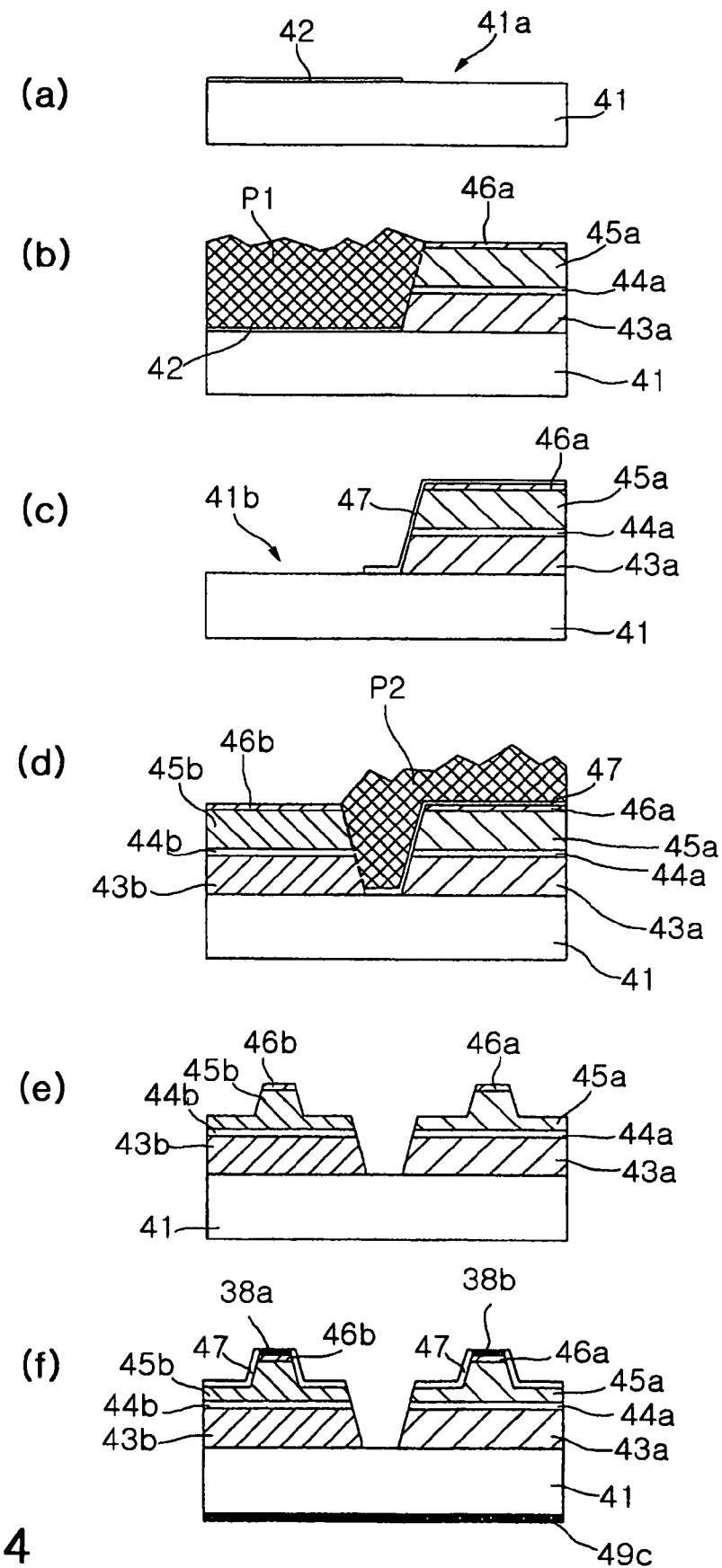
FIGS. 4a through 4f are sectional views illustrating procedures of a fabrication method of a two-wavelength semiconductor laser according to a second embodiment of the present invention.

First, as shown in FIG. 4a, the first dielectric mask 42 with the exposed first area 41a is formed on the n-type GaAs substrate 41. The first dielectric mask 42 may be formed by depositing a dielectric film on the entire upper surface of the substrate 41, and then exposing the first area via appropriate photolithography and etching processes. The thickness of the dielectric film deposited at this time may be about 0.1 to 0.3 μm, and preferably, the first dielectric mask 42 may be of $SiO_2$ or $SiN_x$. During the subsequent growth process of the epitaxial layers, the crystal growth is suppressed on the first dielectric mask 42, whereas the desired crystal growth can be obtained only on the exposed first area 41a.

Thereafter, as shown in FIG. 4b, the epitaxial layers for the first semiconductor laser, i.e. the n-type AlGaAs cladding layer 43a, the AlGaAs-based active layer 44a, the p-type AlGaAs cladding layer 45a and the p-type cap layer 46a are grown in their order on the first area 41a of the n-type GaAs substrate 41. Such growth process may be realized via a MOCVD process. In this case, the crystal growth is suppressed on the first dielectric mask 42 but the undesired polycrystalline P1 may still be formed.

In order to prevent the formation of polycrystalline P1, the growth process may be conducted while removing the polycrystalline with injection of appropriate etching gas. In this case, the component C of $CBr_4$-based etchant used as the etching gas may act as an n-type dopant during the growth of the epitaxial of the first semiconductor laser, which may cause quality defect of the semiconductor laser, thereby weakening morphology of the epitaxial layers. In order to solve such a problem, the present invention adopts a method of removing the already-formed polycrystalline using a lift-off procedure of the dielectric mask. That is, the first dielectric mask 42 is lifted off to remove also the polycrystal layer P1 on the first dielectric mask 42 formed in the step of growing the epitaxial layers of the first semiconductor laser. Preferably, such a lift-off procedure may be conducted more effectively by inducing vibrations via ultrasonic waves as the BOE etchant is applied on the first dielectric mask 42.

Thereafter, as shown in FIG. 4c, a second dielectric mask 47 is formed on the substrate 41 to expose only the second area 41b. The second dielectric mask 47 may be formed by depositing the additional dielectric film, and then exposing the second area 41b via appropriate photolithography and etching processes, similar to the step of forming the first dielectric mask 42. The first dielectric mask 42 may be of $SiO_2$ or $SiN_x$, identical with the first dielectric mask 42. The thickness of the dielectric film deposited at this time is about 0.1 to 0.3 μm.

Thereafter, as shown in FIG. 4d, the epitaxial layers for the second semiconductor laser, i.e. the n-type AlGaInP cladding layer 43b, the AlGaInP-based active layer 44b, the p-type AlGaInP cladding layer 45b and the p-type cap layer 46b are grown in their order on the second area 41b of the GaAs substrate 41. The second area 41b where the growth of the epitaxial layers is conducted, is a surface with the dielectric material (e.g. the first dielectric mask 41b) removed, and thus, not damaged as in the conventional dry etching process of semiconductor crystal, and can maintain the same height as the first area 41a. Therefore, not only high crystallinity of the epitaxial layers for the second semiconductor laser is guaranteed but also inadequate alignment between the two lasers can be prevented. After the epitaxial layers are grown, the second dielectric mask 47 is lifted off to remove also the polycrystal layer P2 on the second dielectric mask 47. As described above, such lifting off process may be facilitated by inducing vibrations using ultrasonic waves as the BOE etchant is applied on the second dielectric mask 47. A HF-based etchant may be used as the BOE etchant in the present invention.

Thereafter, as shown in FIG. 4e, the p-type AlGaAs cladding layer 45a and the p-type AlGaInP cladding layer 45b, together with the p-type cap layers 46a and 46b are selectively etched by the conventional method to form ridge structures for improving current injection efficiency. Such a process for formation of the ridge may be facilitated by inserting an etch-stop layer (not shown) inside each of the p-type cladding layers 45a and 45b.

Finally, as shown in FIG. 4f, the current limiting layers 48a and 48b are formed with dielectric material on the top of the p-type cladding layers 45a and 45b each with a ridge formed, and then photolithography and etching processes are conducted to expose each of the p-type cap layers 46a and 46b. Then the p-side electrodes 49a and 49b and the n-side electrode 49c are formed on the exposed p-type cap layers and the underside of the GaAs substrate 41. In general, the p-side electrodes 49a and 49b are made of at least one selected from a group including Ti, Pt and Au and alloys thereof, and the n-side electrode 49c is made of at least one selected from a group including Au/Ge, Au, Ni and alloys thereof.

The present invention provides two semiconductor lasers having different wavelengths on flat surfaces of the same level by conducting the selective growth procedures of the epitaxial layers using the SAG MOCVD process and the dielectric mask. Moreover, rather than using harmful etchant such as $CBr_4$-based gas or restricting the process conditions to suppress the formation of polycrystalline, the dielectric mask is removed via lifting off process to conveniently remove the undesired polycrystalline.

Although the present invention is described only with the method for fabrication of the two-wavelength semiconductor laser device, it may be adopted to fabricate a three-wavelength semiconductor laser device as well by separating the upper surface of the substrate into three areas rather than two areas, and similarly repeating the processes for forming the second dielectric mask and growing the epitaxial layers of the second semiconductor laser on the additional third area. For example, after the epitaxial layers for the second semiconductor laser are grown, the steps of forming a third dielectric mask on the substrate to expose only the third area, and growing the epitaxial layers for the third semiconductor laser on the third area of the substrate may be further included to provide a fabrication method of a three-wavelength semiconductor laser.

While the present invention has been shown and described in connection with the preferred embodiments, it will be apparent to those skilled in the art that modifications and variations can be made without departing from the spirit and scope of the invention as defined by the appended claims.

As set forth above, in the present invention, selective growth process of the epitaxial layers using the dielectric mask such as a SAG MOCVD process is utilized to more conveniently fabricate the two semiconductor lasers on the same level of substrate. Furthermore, the conventional etching process for the epitaxial layer is omitted to maintain the surface morphology of the crystal growth surface in good condition. As a result, a two-wavelength semiconductor laser with more excellent crystallinity can be manufactured according to the present invention.

What is claimed is:

1. A fabrication method of a multi-wavelength semiconductor laser comprising steps of:
    (a) providing a substrate having an upper surface separated into at least, first and second areas;
    (b) forming a first dielectric mask on the substrate to expose only the first area;
    (c) growing epitaxial layers for a first semiconductor laser on the first area of the substrate;
    (d) forming a second dielectric mask on the substrate to expose only the second area; and
    (e) growing epitaxial layers for a second semiconductor laser on the second area of the substrate,
    wherein the step (d) comprises steps of forming a dielectric film on the upper surface of the substrate where the first dielectric mask remains, and removing a part of the first dielectric mask and the dielectric film to form the second dielectric mask.

2. The fabrication method of a multi-wavelength semiconductor laser according to claim 1, wherein the step (b) comprises steps of forming a dielectric film on the upper surface of the substrate, and removing a part of the dielectric film on the first area to form the first dielectric mask.

3. The fabrication method of a multi-wavelength semiconductor laser according to claim 1, wherein the first dielectric mask and the dielectric film have a thickness of about 0.1 to 0.3 μm, respectively.

4. The fabrication method of a multi-wavelength semiconductor laser according to claim 1, wherein the steps (c) and (e) comprise a step of providing etching gas to prevent the growth of polycrystal layer on the first and second dielectric masks.

5. The fabrication method of a multi-wavelength semiconductor laser according to claim 4, wherein the etching gas is gas containing $CBr_4$.

6. The fabrication method of a multi-wavelength semiconductor laser according to claim 1, further comprising a step of lifting off the first dielectric mask between the steps (c) and (d) to remove a polycrystal layer on the first dielectric mask formed in the step (c).

7. The fabrication method of a multi-wavelength semiconductor laser according to claim 6, wherein the step of lifting off the first dielectric mask is conducted by applying vibration via ultrasonic waves together with BOE etchant on the first dielectric mask.

8. The fabrication method of a multi-wavelength semiconductor laser according to claim 7, wherein the BOE etchant is HF-based etchant.

9. The fabrication method of a multi-wavelength semiconductor laser according to claim 1, further comprising a step of lifting off the second dielectric mask after the step (e) to remove a polycrystal layer on the second dielectric mask formed in (e).

10. The fabrication method of a multi-wavelength semiconductor laser according to claim 9, wherein the step of lifting off the second dielectric mask is conducted by applying vibration via ultrasonic waves together with BOE etchant on the second dielectric mask.

11. The fabrication method of a multi-wavelength semiconductor laser according to claim 10, wherein the BOE etchant is a HF-based etchant.

12. The fabrication method of a multi-wavelength semiconductor laser according to claim 1, wherein the first and second dielectric masks have a width of about 4 to 50 μm, respectively, and the first and second areas have a width of about 2-30 μm, respectively.

13. The fabrication method of a multi-wavelength semiconductor laser according to claim 1, wherein the steps (c) and (e) are conducted by MOCVD method.

14. The fabrication method of a multi-wavelength semiconductor laser according to claim 1, wherein the steps (c) and (e) comprise forming a first conductive cladding layer, an active layer, a second conductive cladding layer, and a cap layer in their order.

15. The fabrication method of a multi-wavelength semiconductor laser according to claim 14, further comprising steps of forming a dielectric film to cover the epitaxial layers of the first and second semiconductor lasers, removing selectively the first and second dielectric masks and the dielectric film to expose the cap layer of the first and second semiconductor lasers, and forming first and second electrodes on the exposed cap layer and on the underside of the substrate, respectively, after the step (e), wherein the dielectric film is provided as a passivation layer together with the remaining first and second dielectric masks.

16. The fabrication method of a multi-wavelength semiconductor laser according to claim 1, wherein the epitaxial layers for the first semiconductor laser comprise an AlGaAs-based semiconductor material, and the epitaxial layers for the second semiconductor laser comprise an AlGaInP-based semiconductor material.

17. The fabrication method of a multi-wavelength semiconductor laser according to claim 1, wherein the first and second dielectric masks comprise $SiO_2$ or $SiN_x$.

* * * * *